United States Patent
Lerdworatawee (10) Patent No.: US 9,595,869 B2
(45) Date of Patent: Mar. 14, 2017

(54) MULTI-LEVEL SWITCHING REGULATOR CIRCUITS AND METHODS WITH FINITE STATE MACHINE CONTROL

(71) Applicant: QUALCOMM Incorporated, San Diego, CA (US)

(72) Inventor: Jongrit Lerdworatawee, Santee, CA (US)

(73) Assignee: QUALCOMM Incorporated, San Diego, CA (US)

( * ) Notice: Subject to any disclaimer, the term of this patent is extended or adjusted under 35 U.S.C. 154(b) by 134 days.

(21) Appl. No.: 14/634,412

(22) Filed: Feb. 27, 2015

(65) Prior Publication Data

US 2016/0254746 A1 Sep. 1, 2016

(51) Int. Cl.
| | |
|---|---|
| H02M 3/158 | (2006.01) |
| H02M 3/07 | (2006.01) |
| H03F 3/21 | (2006.01) |
| H02M 3/157 | (2006.01) |
| H02M 1/00 | (2006.01) |
| H02M 7/487 | (2007.01) |

(52) U.S. Cl.
CPC ............ *H02M 3/158* (2013.01); *H02M 3/07* (2013.01); *H02M 3/157* (2013.01); *H03F 3/21* (2013.01); *H02M 7/487* (2013.01); *H02M 2001/0009* (2013.01); *H02M 2001/0045* (2013.01); *H02M 2003/072* (2013.01); *H03F 2200/102* (2013.01)

(58) Field of Classification Search
CPC .. H02M 2001/0045; H02M 3/06; H02M 3/07; H02M 2003/072; H02M 3/156; H02M 3/157; H02M 3/158; H02M 3/1588; H03F 3/21
See application file for complete search history.

(56) References Cited

U.S. PATENT DOCUMENTS

| | | |
|---|---|---|
| 6,958,924 B2 | 10/2005 | Gateau et al. |
| 8,536,906 B2 | 9/2013 | Sprentall et al. |
| 9,071,165 B2 | 6/2015 | Soua |

(Continued)

FOREIGN PATENT DOCUMENTS

| | | |
|---|---|---|
| EP | 2525484 A1 | 11/2012 |
| FR | 2809548 A1 | 11/2001 |

OTHER PUBLICATIONS

Kim, W., et al., "A Fully-Integrated 3-Level DC-DC Converter for Nanosecond-Scale DVFS", IEEE Journal of Solid-State Circuits, vol. 47, No. 1, Jan. 2012, pp. 206-219.

(Continued)

*Primary Examiner* — Fred E Finch, III
(74) *Attorney, Agent, or Firm* — Haynes and Boone, LLP (57) ABSTRACT

The present disclosure includes multi-level switching regulator circuits and methods with finite state machine control. In one embodiment, a circuit comprises a switching regulator and a finite state machine. The switching regulator comprises high side and low side switches, and at least one capacitor. A finite state machine receiving a switching signal and a duty cycle signal to generate switch control signals to the switches. The switches are turned on and off under control of the finite state machine in response to transitions of the switching signal and the duty cycle signal. The switching signal may be generated from an envelope tracking signal, and the switching regulator may be part of an envelope tracking system.

19 Claims, 9 Drawing Sheets

(56) References Cited

U.S. PATENT DOCUMENTS

| | | | | |
|---|---|---|---|---|
| 2008/0157895 A1* | 7/2008 | Immonen | ............. | H03F 1/0205 |
| | | | | 332/155 |
| 2009/0256539 A1 | 10/2009 | Kotikalapoodi | | |
| 2011/0018511 A1* | 1/2011 | Carpenter | ............. | H02M 3/158 |
| | | | | 323/282 |
| 2012/0212293 A1* | 8/2012 | Khlat | ................... | H03F 1/0227 |
| | | | | 330/127 |
| 2013/0200865 A1 | 8/2013 | Wimpenny | | |
| 2013/0307616 A1* | 11/2013 | Berchtold | ............. | H03F 1/0227 |
| | | | | 330/127 |
| 2014/0044159 A1 | 2/2014 | Poulton et al. | | |
| 2014/0049239 A1 | 2/2014 | Labbe et al. | | |
| 2014/0055197 A1* | 2/2014 | Khlat | ................. | H03F 3/45663 |
| | | | | 330/127 |
| 2014/0062590 A1* | 3/2014 | Khlat | ................... | H03G 3/3042 |
| | | | | 330/127 |
| 2014/0139199 A1* | 5/2014 | Khlat | ................. | H02M 3/1582 |
| | | | | 323/282 |
| 2014/0225674 A1* | 8/2014 | Folkmann | ............. | H03F 1/0222 |
| | | | | 330/297 |
| 2014/0266135 A1* | 9/2014 | Zhak | ...................... | H02M 1/36 |
| | | | | 323/311 |
| 2015/0048883 A1* | 2/2015 | Vinayak | .................. | H02M 3/06 |
| | | | | 330/127 |
| 2015/0188432 A1* | 7/2015 | Vannorsdel | ........... | H02M 3/156 |
| | | | | 323/271 |
| 2016/0006397 A1* | 1/2016 | Wimpenny | ........... | H03F 1/0227 |
| | | | | 330/297 |

OTHER PUBLICATIONS

Yousefzadeh, V., et al., "Three-Level Buck Converter for Envelope Tracking Applications", IEEE Transactions on Power Electronics, vol. 21, No. 2, Mar. 2006, pp. 549-552.

International Search Report—PCT/US2016/015478—ISA/EPO—Jul. 25, 2016.

Written Opinion—PCT/US2016/015478—ISA/EPO—Jul. 25, 2016.

* cited by examiner

MULTI-LEVEL SWITCHING REGULATOR CIRCUITS AND METHODS WITH FINITE STATE MACHINE CONTROL

BACKGROUND

The present disclosure relates to electronic circuits and methods, and in particular, to multi-level switching regulator circuits and methods with finite state machine control.

Figure 1:
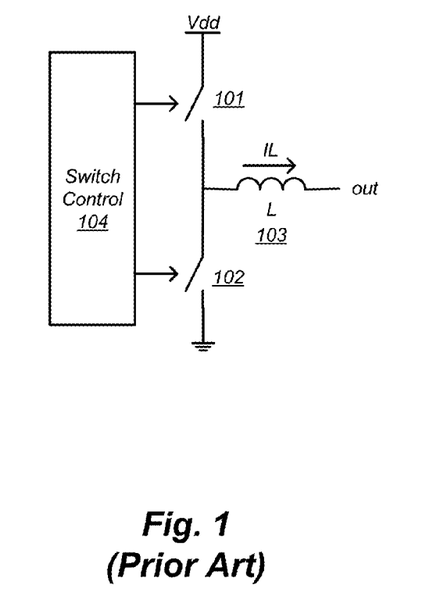
FIG. 1 illustrates an example of one switching regulator topology.

Switching regulators are circuits that produce regulated voltages or currents by switching passive elements in to and out of different electrical configurations. FIG. 1 illustrates an example of one switching regulator topology. In this example switching regulator, switches 101 and 102 are turned on and off so that an input voltage, Vdd, charges an inductor (L) 103. When switch 101 is closed and switch 102 is open, energy is provided to the inductor 103 from Vdd to generate an inductor current IL. Switch 102 is periodically closed and switch 101 is opened, and the inductor current IL continues to flow to an output, "out", as energy in the inductor dissipates. Switches 101 and 102 are controlled by a switch control circuit 104, and the ON/OFF time of each switch may vary according to a number of different application requirements. Switching regulators are very efficient circuits for providing voltages and currents, but suffer from a number of problems in certain applications. For example, one challenge with switching regulators is noise generated by the switches as they are turned ON and OFF. This is referred to as switching noise. The switching noise can be effectively suppressed with the use of a larger inductor. However, using a larger inductor has a drawback of degrading the efficiency, especially if the voltage on the output is changing. Optimizing switching noise and efficiency is a constraint with many existing switching regulator topologies, such as the Buck topology as well as other topologies (e.g., Boost, Flyback, Buckbost, etc. . . . ).

One particular application where switching regulators are sometimes employed is in envelope tracking in a power amplifier application. Achieving high efficiency in a linear power amplifier is challenging, particularly in wireless applications where modulation schemes have become more complicated and their peak to average power ratio increases. Envelope Tracking (ET) is an approach to boost the efficiency of a PA by continuously adjusting its power supply voltage to improve efficiency during transmission.

Figure 2:
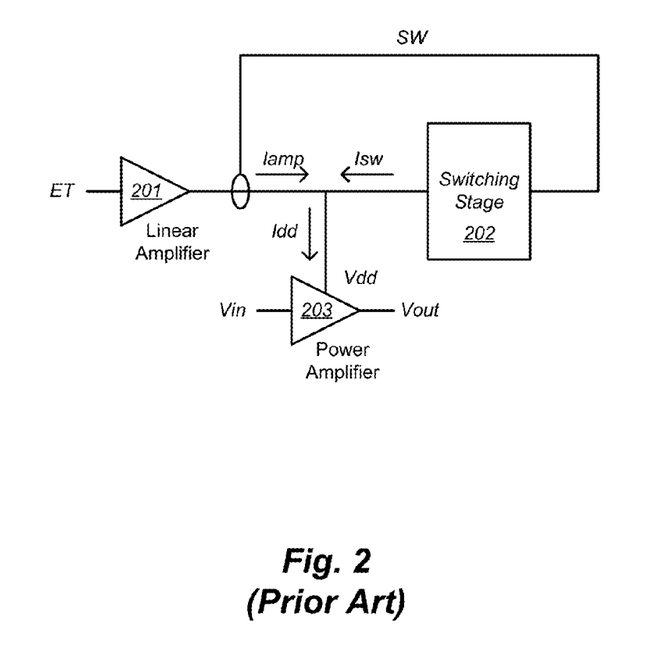
FIG. 2 shows an example configuration for one type of envelope tracking system.

FIG. 2 shows an example configuration for one type of envelope tracking system. In this example, an input signal Vin is provided at the input of a power amplifier (PA) 203 to produce a power amplified signal Vout. PA 203 receives a power supply voltage Vdd and a power supply current Idd from a configuration of a linear amplifier 201 and a switching stage 202. The linear and switching stages work together to adjust the level of Vdd based on the envelope of the power amplifier input signal Vin to improve the efficiency of the power amplifier 203. In this example, linear amplifier 201 receives an envelope tracking signals (ET) representing the envelope of Vin, for example. Linear amplifier 201 may produce a voltage Vdd and current Iamp. Switching stage 202 receives a switching signal SW based on the envelope signal. In this example, SW is generated by sensing Iamp. Switching stage 202 produces a voltage Vdd and current Isw. The sum of currents Iamp and Isw are the power supply current Idd drawn by PA 203. The switching regulator stage 202 boosts the ET's efficiency but it is noisy. The linear regulator stage 201 is higher speed and ensures the optimum power supply voltage to achieve PA's peak efficiency, but it is (power) lossy. Unfortunately, the noise and efficiency are the contradictory performance requirements. Envelope tracking applications sometimes have very stringent requirements on noise and efficiency, as well as other performance metrics such as bandwidth and output voltage dynamic range, for example.

SUMMARY

The present disclosure includes multi-level switching regulator circuits and methods with finite state machine control. In one embodiment, a circuit comprises a switching regulator and a finite state machine. The switching regulator comprises high side and low side switches, and at least one capacitor. A finite state machine receiving a switching signal and a duty cycle signal to generate switch control signals to the switches. The switches are turned on and off under control of the finite state machine in response to transitions of the switching signal and the duty cycle signal. The switching signal may be generated from an envelope tracking signal, and the switching regulator may be part of an envelope tracking system.

The following detailed description and accompanying drawings provide a better understanding of the nature and advantages of the present disclosure.

DETAILED DESCRIPTION

The present disclosure pertains to multi-level switching regulator circuits and methods with finite state machine control. In the following description, for purposes of explanation, numerous examples and specific details are set forth in order to provide a thorough understanding of the present disclosure. It will be evident, however, to one skilled in the art that the present disclosure as expressed in the claims may include some or all of the features in these examples alone or in combination with other features described below, and may further include modifications and equivalents of the features and concepts described herein.

Features and advantages of the present disclosure are described herein with regard to particular examples illustrating various innovative aspects and techniques useful in switching regulators. For instance, particular embodiments may include an innovative hysteretic control technique for a low noise, high efficiency, envelope tracking amplifier with the 3-level buck stage configuration. One example may employ an all-digital control implementation, and hence is able to take advantages of more advanced low cost CMOS technologies where the fast devices are available but they are less voltage-tolerant. Some embodiments may offer significant improvement in terms of the noise and efficiency performance to the conventional envelope tracking technique using the regular buck stage. Certain control schemes disclosed herein are described in the context of envelope tracking, but particular aspects of the disclosure may be more generally applicable to all other switching regulator topologies.

Envelope tracking amplifiers often have stringent requirements for noise, efficiency, bandwidth, and output voltage dynamic range performance. Flying capacitor 3-level buck converters for high-voltage applications may be configured to reduce the voltage stress on each switch by half of the supply voltage, for example. A multi-level topology may also be used for envelope tracking as described in the examples below since it is able to achieve favorable tradeoffs between noise and efficiency, making it possible to choose small components and hence reduce the cost, for example. Applying a multi-level topology to envelope tracking is challenging since the typical PWM control is too slow to meet high bandwidth requirements. Certain embodiments of the disclosure include an all-digital control scheme to provide faster control, for example, and which may take advantages of the advance CMOS technology.

Figure 3:
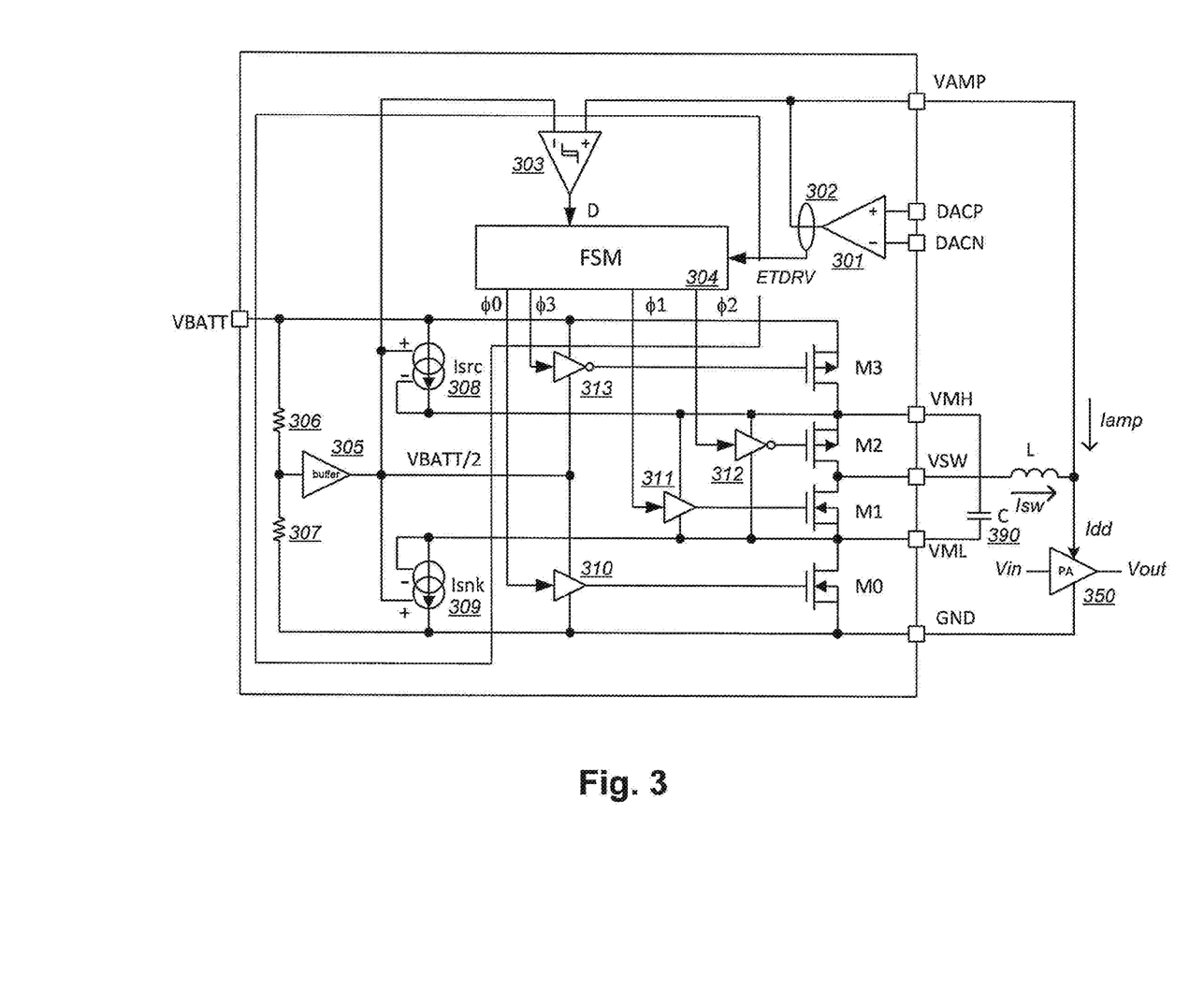
FIG. 3 illustrates a switching regulator circuit according to one embodiment.

FIG. 3 illustrates a switching regulator circuit according to one embodiment. In one embodiment, a switching regulator includes high side switches, low side switches, an output inductor, and control circuit (here, a finite state machine—FSM). This example illustrates advantageous features of the disclosure applied to envelope tracking, but the features described here are also applicable to other switching regulator topologies (e.g., buck, boost, buckboost, flyback, etc.). In this example, a power amplifier (PA) 350 receives an input signal to be amplified, Vin, and produces a power amplifier output signal, Vout, which in some applications (e.g., wireless transmitters) may be coupled to an antenna, for example. A multi-level switching regulators according to the present disclosure may include a plurality of high side switches (e.g., transistors M2 and M3), a plurality of low side switches (e.g., transistors M0 and M1), and at least one capacitor (C) 390. In this example, capacitor 390 has a first terminal coupled to a first node between the high side switches (e.g., M2 and M3) and a second terminal coupled to a second node between the low side switches (e.g., M0 and M1). The high side switches and low side switches receive switch control signals $\phi 3$, $\phi 2$, $\phi 1$, and $\phi 0$ generated by a finite state machine 304 to turn the switches on and off. In this example, the switches are MOS transistors, and the switch control signals are received through driver circuits 310-313, where circuits 310 and 311 are non-inverting and circuits 312 and 313 are inverting.

Features and advantages of the present disclosure include a finite state machine (FSM) 304 that receives a switching signal (e.g., ETDRV) and a duty cycle signal (e.g., D) to generate the switch control signals by providing inputs to the driver circuits. In this example, FSM 304 produces switch control signals $\phi 3$, $\phi 2$, $\phi 1$, and $\phi 0$ to control the high side switches and the low side switches based on the switching signal and the duty cycle signal. For example, a duty cycle signal may correspond to a duty cycle being above or below a threshold (e.g., 50% Duty Cycle), and a switching signal may be generated by an amplifier indicating a polarity of current from the amplifier (e.g., positive or negative) in response to a control signal at the amplifier input. The high side switches and the low side switches are turned on and off under control of the finite state machine in response to transitions of the switching signal and the duty cycle signal.

In various embodiments, the amplifier may be an error amplifier or envelope tracking amplifier, for example, and the control signal may be an error signal or a time varying control signal (e.g., an envelope tracking (ET) signal or an average power tracking (APT) signal), respectively. In the example shown in FIG. 3, the amplifier is an envelope tracking amplifier 301 receiving a differential envelope tracking signal (DACP/DACN) generated by a digital-to-analog converter (not shown), for example. Current from amplifier 301, Iamp, is sensed by a current sensor 302, which may be a resistor or similar current sense scheme, for example. In one embodiment, current sensor 302 comprises a current sense hysteretic controller to sense an output current from the amplifier, and in accordance therewith, generate a switching signal to the switching regulator. One example implementation of a current sense hysteretic controller is shown below, and may include a series resistor configured between input terminals of a hysteretic comparator, for example. Current sensor 302 generates a switching signal, which in this example is ETDRV. In this example, ETDRV represents positive and negative current from amplifier 301. Switching signal ETDRV is provided as an input to FSM 304.

FSM 304 may also receive a duty cycle signal D corresponding to a duty cycle of the switching regulator. In this example, an output voltage VAMP is compared to a reference voltage to determine a duty cycle and generate the duty cycle signal, D. In one embodiment, a comparator 303 may be used to compare the output voltage to the reference voltage. In this example, comparator 303 is a hysteretic comparator and the reference voltage is one-half the power supply voltage. For instance, a power supply terminal may receive a power supply voltage (here, VBATT). This example circuit uses a resistor divider comprising series resistors 306 and 307 to divide down VBATT. A buffer 305 is used to generate VBATT/2, which is provided to one input of comparator 303. A second input of comparator 303 is coupled to an output terminal of the switching regulator to receive a switching regulator output voltage VAMP. VBATT is also the power supply voltage input to the switching regulator at switch M3. The duty cycle is the ratio of the switching regulator output voltage (VAMP) to the switching regulator input voltage (VBATT). Fifty-percent (50%) duty cycle, as an example, may correspond to VAMP=VBATT/2 (i.e., VAMP/VBATT=0.5).

Finite state machine 304 may turn switches M0-M3 on and off based on changes in the duty cycle signal, D, and switching signal, ETDRV. For an envelope tracking application, the voltage VAMP is the power supply voltage to PA 350.

Figure 4A:
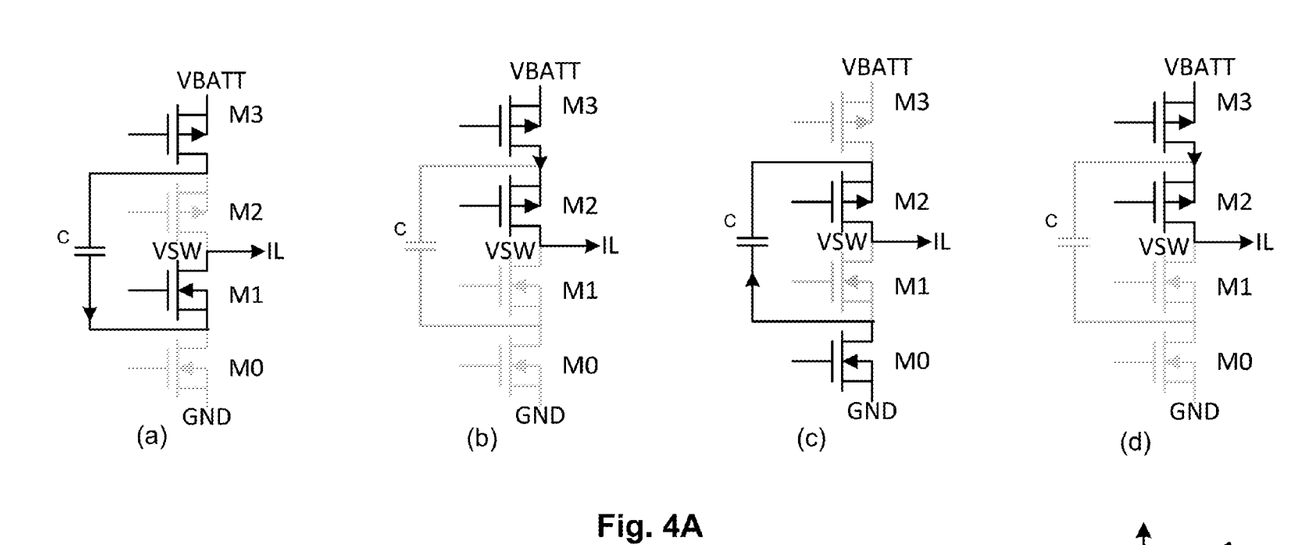
FIG. 4A illustrates the operation of the circuit for a high duty cycle according to an embodiment.

FIG. 4A illustrates the operation of the circuit for a high duty cycle according to an embodiment. When the duty cycle is greater than a threshold, such as 50%, the finite state machine controls the high side switches and the low side switches to transition through a predetermined sequence of states in response to changes in the switching signal. In this example, the predetermined sequence of states alternately couples the inductor L to a power supply voltage and a fraction of the power supply voltage (e.g., VBATT/2) stored on the capacitor. The state sequence in the FSM is described in more detail below.

In this example, assume the switching regulator switches are initially in a state as shown at (a), wherein M3 is turned on, M2 is turned off, M1 is turned on, and M0 is turned off. In this state, the high side switches are configured to charge the capacitor C and the low side switches are configured to couple the capacitor to an inductor. Specifically, in this state VBATT is coupled to a terminal of capacitor C through M3, thus charging capacitor C. Capacitor C stores a voltage equal to VBATT/2. Thus, with transistor M1 turned on, one terminal of inductor L is coupled to a voltage VBATT/2 on the other terminal of capacitor C, which supplies charge. In this state, the inductor current IL will decrease (ramp down).

Figure 4B:
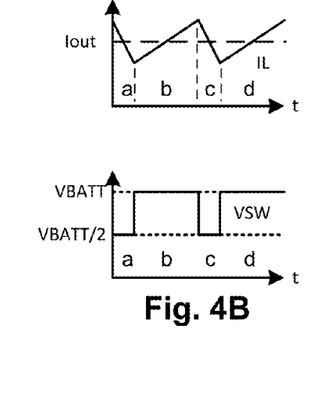
FIG. 4B illustrates waveforms for the circuit of FIG. 4A.

FIG. 4B illustrates waveforms for the circuit of FIG. 4A. As illustrated in FIG. 4B, inductor current IL during a time period the circuit is configured in state (a) ramps down. Accordingly, the amplifier current Iamp is initially low and ramping up. In this example, when Iamp increases sufficiently, the output of current sense circuit 302 changes the state of switching signal ETDRV indicating that Iamp has transitioned from negative polarity to a positive polarity (e.g., at a zero crossing of Iamp and IL). A delay between Iamp transitioning from negative to positive and the transition of ETDRV may be due to hysteresis in a comparator in current sensor 302, for example. FSM 304 responds to a change in ETDRV with a change in state, which causes a change in the output signals .phi.3, .phi.2, .phi.1, and .phi.0 from (i.e., M3 on, M2 off, M1 on, M0 off) to (i.e., M3 on, M2 on, M1 off, M0 off) as shown at (b).

In this state, the high side switches couple the inductor to the power supply voltage, VBATT, and the low side switches are open circuited. Accordingly, current IL begins to ramp up as shown at (b) in FIG. 4B and amplifier current Iamp (previously positive and increasing) ramps down.

When Iamp decreases sufficiently, the output of current sense circuit 302 changes the state of switching signal ETDRV indicating that Iamp has transitioned from positive polarity to a negative polarity. FSM 304 responds to a change in ETDRV with another change in state, which causes a change in the output signals φ3, φ2, φ1, and φ0 from [1100] (i.e., M3 on, M2 on, M1 off, M0 off) to [0101] (i.e., M3 off, M2 on, M1 off, M0 on) as shown at (c).

In this state, the low side switches are configured to discharge the capacitor C and the high side switches are configured to couple the capacitor to the inductor. Specifically, in this state a reference voltage (here, ground (GND)) is coupled to a terminal of capacitor C through M0, thus discharging capacitor C. Capacitor C stores a voltage equal to VBATT/2. Thus, with transistor M2 turned on, one terminal of inductor L is coupled to a voltage VBATT/2 on capacitor C, which supplies charge, and the inductor current IL will decrease (ramp down). Inductor current IL ramps down as shown at (c) in FIG. 4B and amplifier current Iamp (previously negative and decreasing) ramps up.

When Iamp increases sufficiently, the output of current sense circuit 302 changes the state of switching signal ETDRV indicating that Iamp has transitioned from negative polarity to a positive polarity. FSM 304 responds to a change in ETDRV with another change in state, which causes a change in the output signals φ3, φ2, φ1, and φ0 from [0101] (i.e., M3 off, M2 on, M1 off, M0 on) to [1100] (i.e., M3 on, M2 on, M1 off, M0 off) as shown at (d). State (d) operates the switches the same as state (b) by causing the high side switches to couple the inductor to the power supply voltage, but transitions back to state (a) ([1010]) when ETDRV changes state. Accordingly, when the duty cycle signal is unchanged (e.g., D=1, greater than 50%), FSM 305 may transition through a full cycle comprising four (4) states as illustrated above in response to changes in the switching signal.

Voltages on the switching node VSW are shown in FIG. 4B. As shown in FIG. 4B, for an example duty cycle of 50%, VSW switches between the power supply voltage, VBATT, and one-half the power supply voltage, VBATT/2. Accordingly, the switches M0-M3 operate at lower voltages with reduced stress. Referring to FIG. 3, additional shunt regulators Isrc 308 and Isnk 309 may be used to supplement current loss caused by an imbalance between charging and discharging, for example.

Figures 5A, 5B:
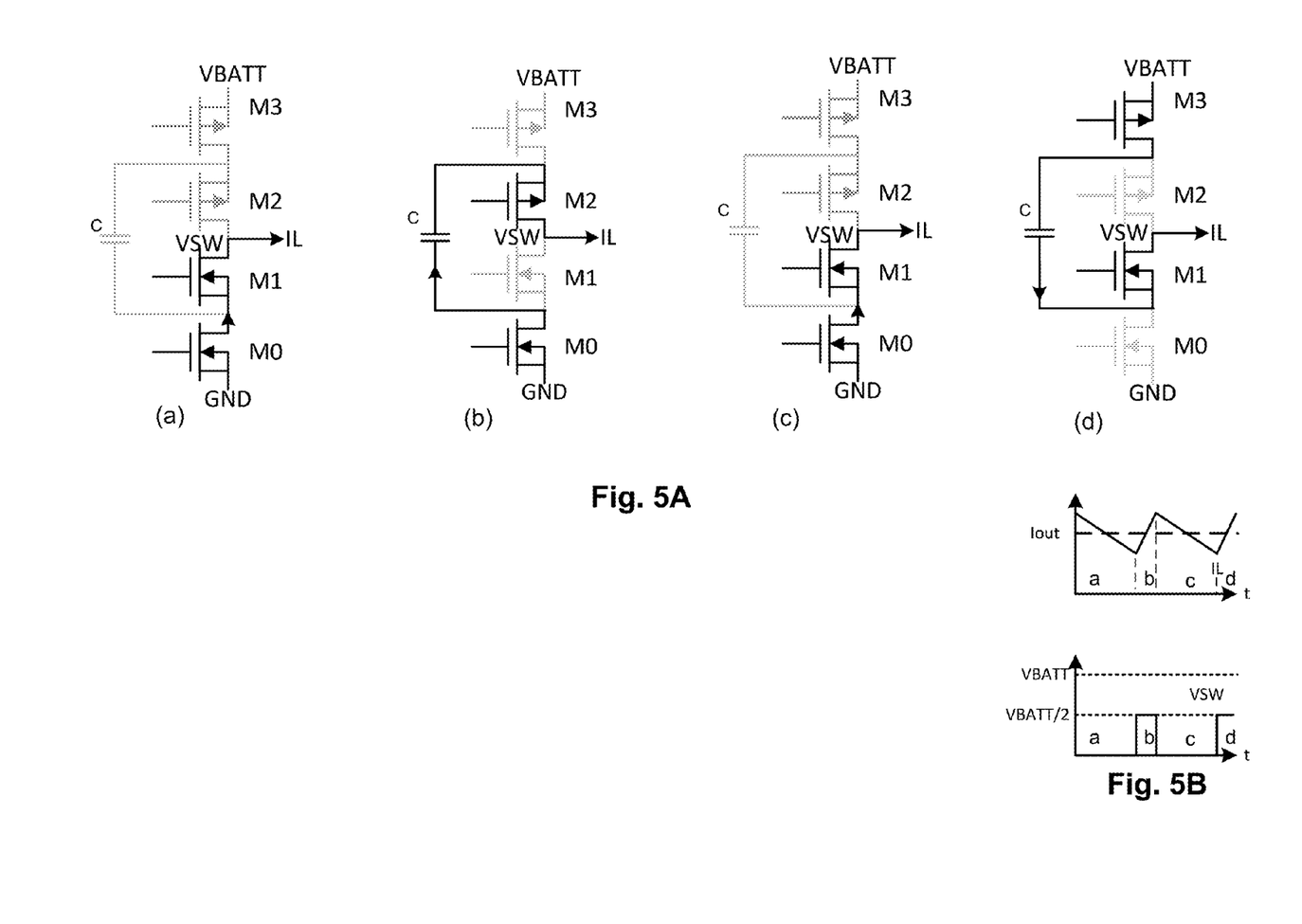
FIG. 5A illustrates the operation of the circuit for a low duty cycle according to an embodiment.
FIG. 5B illustrates waveforms for the circuit of FIG. 5A.

FIG. 5A illustrates the operation of the circuit for a low duty cycle according to an embodiment. When the duty cycle is less than a threshold, such as 50%, the finite state machine controls the high side switches and the low side switches to transition through a predetermined sequence of states in response to changes in the switching signal. In this example, the predetermined sequence of states alternately couples the inductor L to a reference voltage (e.g., ground) and a fraction of the power supply voltage (e.g., VBATT/2) stored on the capacitor. The state sequence in the FSM for this sequence is also described in more detail below.

In this example, assume the switching regulator switches are initially in a state as shown at (a) [0011], where M3 is turned off, M2 is turned off, M1 is turned on, and M0 is turned on. In this state, the low side switches are configured to couple the inductor to ground, and the high side switches are open circuited. FIG. 4B illustrates waveforms for the circuit of FIG. 4A, which shows current IL ramping down during state (a). Accordingly, amplifier current Iamp (previously negative and decreasing) ramps up.

When Iamp increases sufficiently, the output of current sense circuit 302 changes the state of switching signal ETDRV indicating that Iamp has transitioned from negative polarity to a positive polarity. FSM 304 responds to a change in ETDRV with another change in state, which causes a change in the output signals φ3, φ2, φ1, and φ0 from [0011] (i.e., M3 off, M2 off, M1 on, M0 on) to [0101] (i.e., M3 off, M2 on, M1 off, M0 on) as shown at (b) in FIG. 5A.

In this state, low side switches are configured to discharge the capacitor C and the high side switches are configured to couple the capacitor to an inductor. Specifically, in this state ground is coupled to a terminal of capacitor C through M0, thus discharging capacitor C. Capacitor C stores a voltage equal to VBATT/2. Thus, with transistor M2 turned on, one terminal of inductor L is coupled to a voltage VBATT/2 on the other terminal of capacitor C, which supplies charge. In this state, the inductor current IL will increase (ramp up).

As illustrated in FIG. 5B, inductor current IL during a time period the circuit is configured in state (b) ramps up. Accordingly, the amplifier current Iamp is initially high and ramping down. In this example, when Iamp decreases sufficiently, the output of current sense circuit 302 changes the state of switching signal ETDRV indicating that Iamp has transitioned from positive polarity to a negative polarity. FSM 304 responds to a change in ETDRV with another change in state, which causes a change in the output signals.phi.3, .phi.2, .phi.1, and .phi.0 from [0101] (i.e., M3 off, M2 on, M1 off, M0 on) to (i.e., M3 off, M2 off, M1 on, M0 on) as shown at (c) in FIG. 5A.

State (c) in FIG. 5A operates the switches the same as state (a) in FIG. 5A by causing the low side switches to couple the inductor to ground, but transitions to state (d) ([1010]) when ETDRV changes state. In state (c), inductor current IL decreases and Iamp increases. When Iamp increases sufficiently, the output of current sense circuit 302 changes the state of switching signal ETDRV indicating that Iamp has transitioned from negative polarity to a positive polarity. FSM 304 responds to a change in ETDRV with another change in state, which causes a change in the output signals .phi.3, .phi.2, .phi.1, and .phi.0 from [0011] (i.e., M3 off, M2 off, M1 on, M0 on) to [1010] (i.e., M3 on, M2 off, M1 on, M0 off) as shown at (d).

In this state, the high side switches are configured to charge the capacitor C and the low side switches are configured to couple the capacitor to the inductor. Specifically, in this state VBATT is coupled to a terminal of capacitor C through M3, thus charging capacitor C. Capacitor C stores a voltage equal to VBATT/2. Thus, with transistor M1 turned on, one terminal of inductor L is coupled to a voltage VBATT/2 on capacitor C, which supplies charge, and the inductor current IL will increase (ramp up). Inductor current IL ramps up as shown at (d) in FIG. 5B and amplifier current Iamp (previously positive and increasing) ramps down.

When Iamp decreases sufficiently, the output of current sense circuit 302 changes the state of switching signal ETDRV indicating that Iamp has transitioned from positive polarity to a negative polarity. FSM 304 responds to a change in ETDRV with another change in state, which causes a change in the output signals φ3, φ2, φ1, and φ0 from [1010] (i.e., M3 on, M2 off, M1 on, M0 off) back to state (a) [0011] (i.e., M3 off, M2 off, M1 on, M0 on). Accordingly, when the duty cycle signal is unchanged (e.g., D=0, less than 50%), FSM 305 may transition through a full cycle comprising four (4) states as illustrated in FIG. 5A in response to changes in the switching signal. Similar to FIG. 4A, VSW switches between one-half the power supply voltage, VBATT/2 and ground. Accordingly, the switches M0-M3 operate at lower voltages with reduced stress.

Figure 6A:
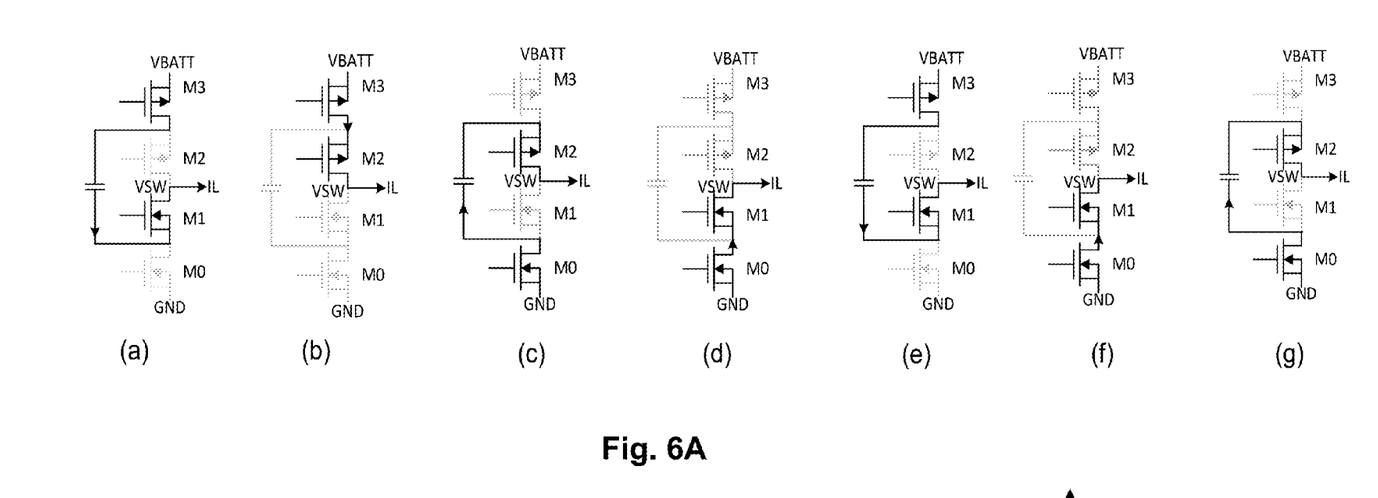
FIG. 6A illustrates the operation of the circuit transitioning from a high duty cycle to a low duty cycle according to an embodiment.

FIG. 6A illustrates the operation of the circuit transitioning from a high duty cycle to a low duty cycle according to an embodiment. Under various operating conditions, the output voltage of the switching regulator (e.g., VAMP in FIG. 3) may change, which in turn may change the duty cycle. Embodiments of the disclosure may monitor the duty cycle and change the state of a duty cycle signal (e.g., D in FIG. 3), which may cause state transitions in a finite state machine and corresponding changes in the states of high side switches and low side switches in the switching regulator. However, features and advantages of the present disclosure include constraining the FSM states that respond to changes in the duty cycle signal such that the FSM may only respond to changes in the duty cycle signal with corresponding changes in the high and/or low side switches when the FSM is in one or more particular states.

As illustrated by FIG. 6, when a duty cycle crosses a threshold the finite state machine controls the high side switches and the low side switches to transition through particular states of the states in the FSM response to changes in the switching signal. However, not all states in the FSM are responsive to changes in the duty cycle signal, and the FSM may limit changes in the high and/or low side switches that are responsive to changes in the duty cycle to particular states. Accordingly, changes in the duty cycle signal corresponding to the duty cycle crossing the threshold do not change the state of the high side switches and the low side switches if the finite state machine is not in one of the particular states responsive to such changes.

This is illustrated in FIG. 6A, which shows a sequence of high and low side switches when the duty cycle signal transitions from logic 1 to logic 0, for example. Since D is initially logic 1, the sequence of states is the same as shown in FIG. 4A. However, when D transitions from 1 to 0, the FSM is not immediately responsive. Rather, the FSM may only transition from the state sequence in FIG. 4A to the state sequence in FIG. 5A when the FSM is in particular states. In this example, states (a)-(b) are D=1 states, and the transition occurs on state (c), which is particular state shared by both the state sequences for the duty cycle above and below the threshold (e.g., 50%). State (d) corresponds to D=0 state (c) in FIG. 5A, for example.

Figure 6B:
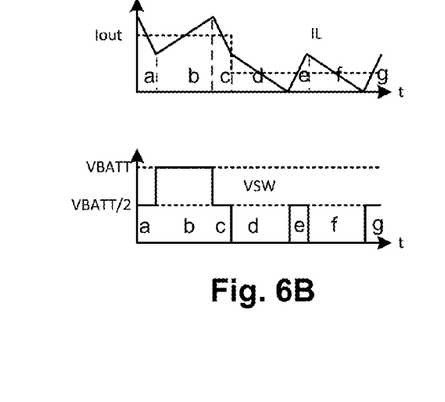
FIG. 6B illustrates waveforms for the circuit of FIG. 6A.

FIG. 6B illustrates waveforms for the circuit of FIG. 6A. FIG. 6B illustrates that at state (c) the system transitions from high duty cycle operation where VSW switches between VBATT and VBATT/2 as in FIG. 4A, to low duty cycle operation where VSW switches between VBATT/2 and ground as in FIG. 5A.

Generally, the sequence in FIG. 6A illustrates that the high side switches and the low side switches are responsive to changes in the duty cycle signal after the high side switches and the low side switches are configured in particular states that charge or discharge the flying capacitor. For example, in FIG. 6A, state (c) discharges capacitor C prior to transitioning to low duty cycle operation.

Figure 7:
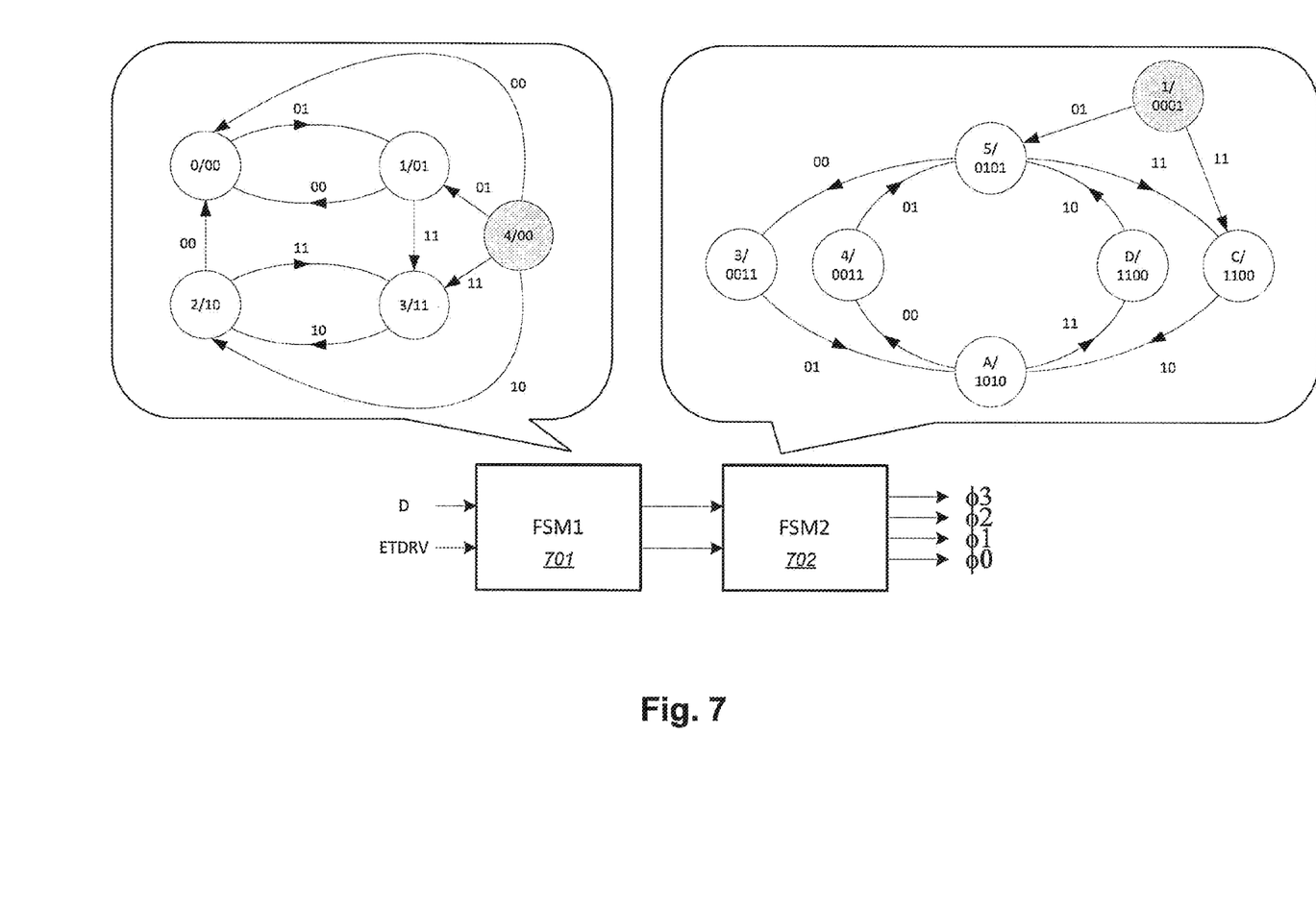
FIG. 7 illustrates an example finite state machine according to an embodiment.

FIG. 7 illustrates an example finite state machine according to an embodiment. In this example, an FSM comprises a first stage FSM (FSM1) 701 and a second stage FSM (FSM2) 702. FSM1 701 receives a duty cycle signal, D, and a switching signal, ETDRV and comprises five (5) states described below. FSM2 702 receives the outputs of FSM1 701 and comprises seven (7) states also described below. FSM2 702 generates switch control signals φ3, φ2, φ1, and φ0 that control the on and off state of high side and low side switches as described above.

Figure 8:
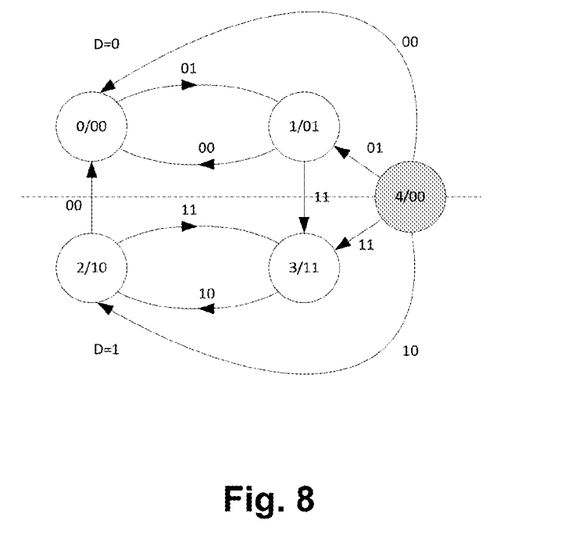
FIG. 8 illustrates a first stage of a finite state machine according to an embodiment.

FIG. 8 illustrates a first stage of a finite state machine according to an embodiment. In this diagram, a circle represents a state and transitions between states are represented by arrows. Inputs that result in transitions are shown above the arrows, and outputs are shown in the circles. For example, if FSM1 is in state 0/00 and receives a 01 input (i.e., D=0 and ETDRV=1), then FSM1 transitions to state 1/01 and outputs a 01. Note that when D=0, input transitions of ETDRV are reflected to the output and input transitions of D do not cause changes in the output. Transitions in D may only transition to D=1 state 3/11 from state 1/01. Similarly, when D=1, input transitions of ETDRV are reflected to the output and input transitions of D do not cause changes in the output. Transitions in D may only transition to D=0 state 0/00 from state 2/10. Accordingly, transition between a D=1 cycle and D=0 cycle may be controlled to ensure the complete cycle of charge and discharge of a flying capacitor during transition, for example, as mentioned above. FSM1 may condition the inputs D and ETDRV and prevent invalid transitions to FSM2, for example. 4/00 is a standby state at the beginning of the FSM, where exit occurs when the system is enabled.

Figure 9:
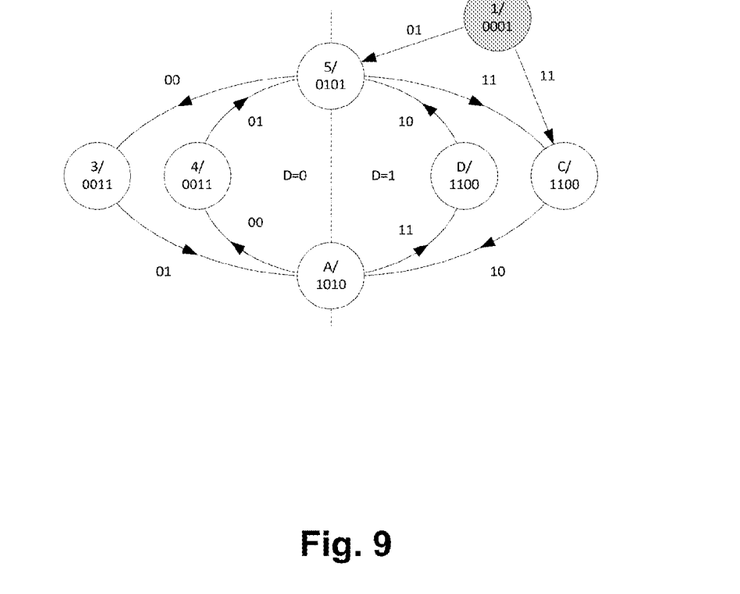
FIG. 9 illustrates a second stage of a finite state machine according to an embodiment.

FIG. 9 illustrates a second stage of a finite state machine according to an embodiment. As illustrated in FIG. 9, FSM2 may have a plurality of states for turning the high side and low side switches on and off. A first plurality of states correspond to a duty cycle above a threshold (e.g., D=1; >50% Duty Cycle), and a second plurality of states correspond to a duty cycle below a threshold (e.g., D=0; <50%

Duty Cycle). Referring to FIGS. 4A and 9, when D=1, high side and low side transistors M0-M3 may transitions as follows: state (a) in FIG. 4A corresponds to A/1010, state (b) in FIG. 4A corresponds to D/1100, state (c) in FIG. 4A corresponds to 5/0101, and state (d) in FIG. 4A corresponds to C/1100, where transitions between states are caused by changes in switching signal ETDRV, which are passed through FSM1 and shown in FIG. 9 next to the arrows between states (e.g., [D, ETDRV]=[11], [10], [11], [10]). As long as duty cycle signal D remains unchanged, FSM2 will remain in one of states A/, D/, 5/, and C/.

However, when D transitions to 0 response to the duty cycle falling below a threshold, for example, FSM2 may transition through states 3/ and 4/ as well as states 5/and A/. However, FSM2 may only transition on states that are shared by both the D=1 cycle and the D=0 cycle—e.g., states 5/ and A/. Accordingly, if D transitions to 0 while FSM2 is in state D/, the system will wait until FSM2 is in 5/ (e.g., wait until ETDRV transitions) before starting a low duty cycle state sequence. In other words, FSM2 may only enter a different duty cycle sequence when FSM2 is in a state shared by a low duty cycle sequence and a high duty cycle sequence. For the low duty cycle (D=0) sequence shown in FIG. 5A, high side and low side transistors M0-M3 may transitions as follows: state (a) in FIG. 5A corresponds to 4/0011, state (b) in FIG. 5A corresponds to 5/0101, state (c) in FIG. 5A corresponds to 3/0011, state (c) in FIG. 5A corresponds to A/1010.

Figure 10:
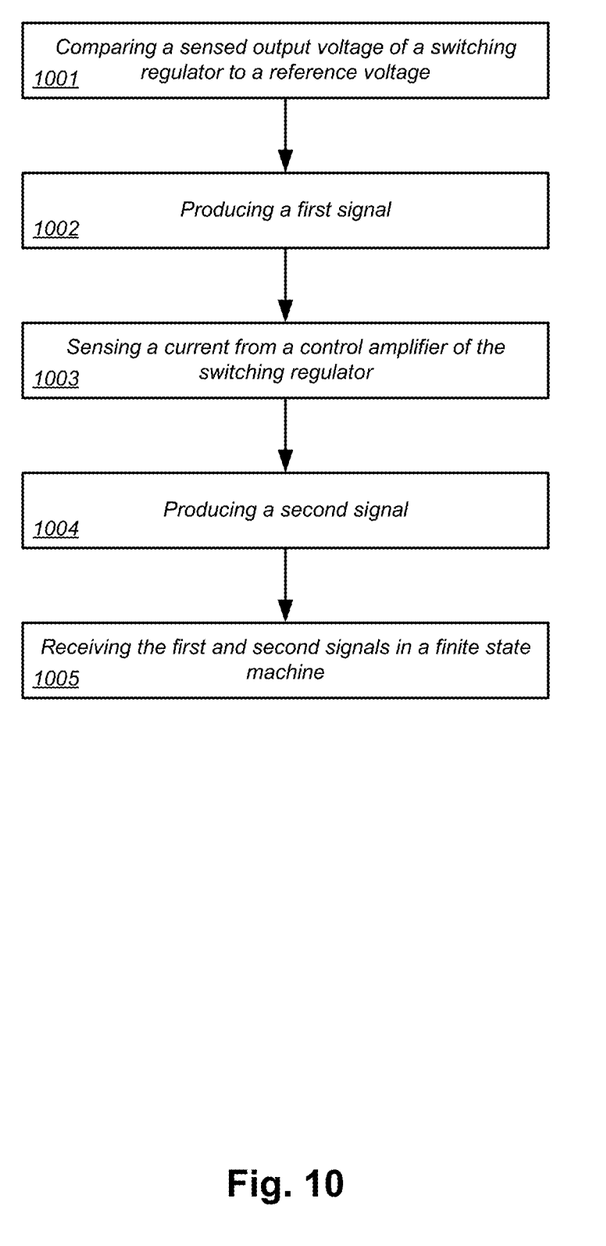
FIG. 10 illustrates method according to an embodiment.

FIG. 10 illustrates method according to an embodiment. At 1001, a sensed output voltage of a switching regulator may be compared to a reference voltage, such as one-half a power supply voltage, and in accordance therewith, a first signal is produced at 1002. The first signal may be a digital signal for example generated by hysteretic comparator. At 1003, a current is sensed from a control amplifier of the switching regulator, and in accordance therewith, a second signal is produced at 1004. The second signal may be a digital signal, for example, generated by another hysteretic comparator with a series resistor configured between the comparator's input terminals to sense a polarity of the current from the control amplifier. In one embodiment a control amplifier is part of a feedback loop in a switching regulator. In another embodiment the control amplifier is an envelope tracking amplifier that receives an envelope tracking signal ET, for example. At 1005, the first and second signals are received in a finite state machine. The finite state machine generates switch control signals to turn a plurality of series configured switches and a capacitor in an output stage on and on response to changes in the first signal and the second signal.

Figure 11:
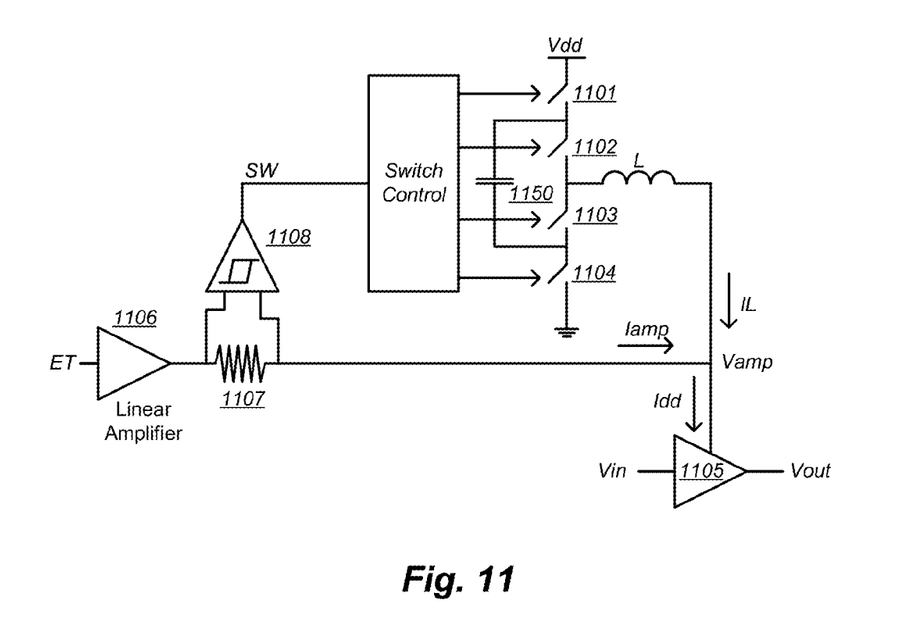
FIG. 11 illustrates an example circuit including a current sense hysteretic controller according to an embodiment.

FIG. 11 illustrates an example circuit including a current sense hysteretic controller according to an embodiment. In this example, a switching regulator comprises a first switch 1101 having a first terminal coupled to a power supply voltage Vdd, a second switch 1102 configured between the first switch 1101 and a switching node, a third switch 1103 coupled to the switching node, and a fourth switch 1004 configured between the third switch 1103 and a reference voltage, ground. The switching regulator further includes an inductor L having a first terminal coupled to the switching node and a second terminal and a capacitor 1150 having a first terminal configured between the first switch 1101 and the second switch 1102 and a second terminal configured between the third switch 1103 and the fourth switch 1104. In this example, a linear amplifier 1106 receives an envelope tracking signal. The amplifier 1106 may have an input to receive a time varying voltage control signal (e.g. an ET signal or an APT signal) and an output to produce an output voltage Vamp, which in this example is the power supply voltage for a power amplifier 1105. The output of the amplifier 1105 is coupled to the second terminal of the inductor L. A current sense hysteretic controller senses an output current Iamp from the amplifier 1106, and in accordance therewith, generates a switching signal to the switching regulator. In this example, a current sense hysteretic controller includes a resistor 1107 configured in series with amplifier output current Iamp between two inputs of a comparator 1108 having hysteresis. An output of the comparator is a switching signal SW, which drives switch control circuitry 1150 for turning switches 1101-1104 on and off. One example switch control circuit 1150 may include a finite state machine described above, although other ET and APT applications may benefit from performance characteristics of a multi-level switching regulator.

Figure 12:
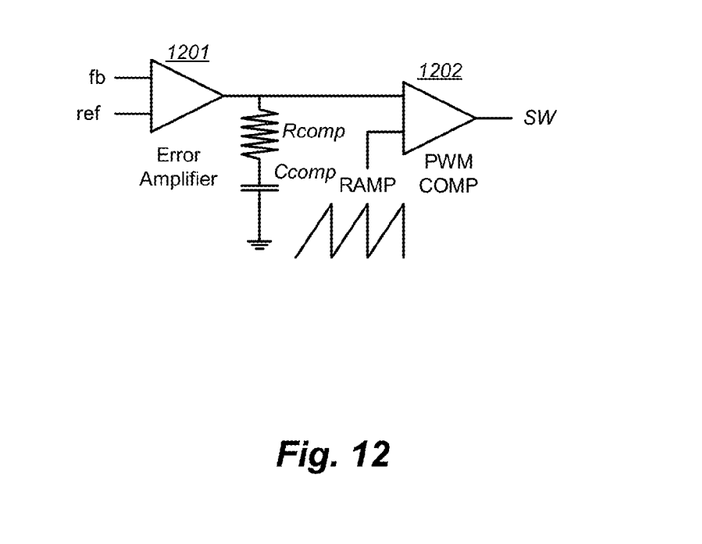
FIG. 12 illustrates an example switching regulator feedback loop according to another embodiment.

FIG. 12 illustrates an example switching regulator feedback loop according to another embodiment. In this example, a switching signal is generated from an error amplifier 1201 and pulse width modulated (PWM) comparator 1202. Error amplifier may receive a feedback signal, fb, such as a voltage or current, and a reference signal and produce an error signal. The output of error amplifier may be coupled to a compensation network comprising resistor Rcomp and capacitor Ccomp, for example, and to the input PWM comparator 1202. In this example, the other input of PWM comparator 1202 receives a ramp signal "RAMP" and produces a switching signal on the output.

The above description illustrates various embodiments of the present disclosure along with examples of how aspects of the particular embodiments may be implemented. The above examples should not be deemed to be the only embodiments, and are presented to illustrate the flexibility and advantages of the particular embodiments as defined by the following claims. Based on the above disclosure and the following claims, other arrangements, embodiments, implementations and equivalents may be employed without departing from the scope of the present disclosure as defined by the claims.

What is claimed is:

1. A circuit comprising:
  a switching regulator comprising a plurality of high side switches, a plurality of low side switches, and at least one capacitor having a first terminal coupled to a first node between the high side switches and a second terminal coupled to a second node between the low side switches, wherein the high side switches and the low side switches receive switch control signals; and
  a finite state machine receiving a switching signal and a duty cycle signal and generating the switch control signals, the switching signal being a digital signal indicating a polarity of an output current of the switching regulator and the duty cycle signal being a digital signal indicating whether a duty cycle of an output voltage of the switching regulator is above a threshold duty cycle,
  wherein the high side switches and the low side switches are turned on and off under control of the finite state machine in response to transitions in state of the switching signal and the duty cycle signal.

2. The circuit of claim 1 wherein when the duty cycle of the output voltage is greater than the threshold duty cycle the finite state machine controls the high side switches and the low side switches to transition through a predetermined sequence of states in response to transitions in state of the switching signal.

3. The circuit of claim 2 wherein the predetermined sequence of states alternately couple an inductor to a power supply voltage and a fraction of the power supply voltage stored on the at least one capacitor.

4. The circuit of claim 2 wherein the predetermined sequence of states comprises, in order:
a first state wherein the high side switches are configured to charge the at least one capacitor and the low side switches are configured to couple the at least one capacitor to an inductor;
a second state wherein the high side switches couple the inductor to a power supply voltage;
a third state wherein the high side switches are configured to couple the at least one capacitor to the inductor and the low side switches are configured to discharge the at least one capacitor; and
a fourth state wherein the high side switches couple the inductor to the power supply voltage.

5. The circuit of claim 1 wherein when duty cycle of the output voltage is less than the threshold duty cycle the finite state machine controls the high side switches and the low side switches to transition through a predetermined sequence of states in response to transitions in state of the switching signal.

6. The circuit of claim 5 wherein the predetermined sequence of states alternately couple an inductor to a fraction of a power supply voltage stored on the at least one capacitor and a reference voltage.

7. The circuit of claim 5 wherein the predetermined sequence of states comprises, in order:
a first state wherein the low side switches couple an inductor to a reference voltage;
a second state wherein the high side switches are configured to charge the at least one capacitor and the low side switches are configured to couple the at least one capacitor to the inductor;
a third state wherein the high side switches couple the inductor to the reference voltage; and
a fourth state wherein the high side switches are configured to couple the at least one capacitor to the inductor and the low side switches are configured to discharge the at least one capacitor.

8. The circuit of claim 1 wherein when the duty cycle of the output voltage crosses the threshold duty cycle the finite state machine controls the high side switches and the low side switches to transition through particular states of a plurality of states in response to transitions in state of the switching signal, and wherein changes in the duty cycle signal corresponding to the duty cycle of the output voltage crossing the threshold duty cycle do not change the state of the high side switches and the low side switches if the finite state machine is not in one of said particular states.

9. The circuit of claim 8 wherein the high side switches and the low side switches are responsive to changes in the duty cycle signal after the high side switches and the low side switches are configured in particular states that charge or discharge the at least one capacitor.

10. The circuit of claim 1 wherein the high side switches comprise a first switch configured to receive a power supply voltage and a second switch configured between the first switch and a switching node, wherein the low side switches comprise a third switch coupled to the switching node and a fourth switch configured between the third switch and a reference voltage, wherein the at least one capacitor is a single capacitor having a first terminal coupled to a first node between the first switch and the second switch and a second terminal coupled to a second node between the third switch and the fourth switch.

11. The circuit of claim 10 wherein, when the duty cycle of the output voltage is greater than fifty percent (50%) the finite state machine controls the first, second, third, and fourth switches to transition through a sequence of states that in order include a first state, a second state, a third state, and a fourth state, wherein
in the first state, the first switch is turned on, the second switch is turned off, the third switch is turned on, and the fourth switch is turned off;
in the second state following the first state, the first switch is turned on, the second switch is turned on, the third switch is turned off, and the fourth switch is turned off;
in the third state following the second state, the first switch is turned off, the second switch is turned on, the third switch is turned off, and the fourth switch is turned on; and
in the fourth state following the third state, the first switch is turned on, the second switch is turned on, the third switch is turned off, and the fourth switch is turned off.

12. The circuit of claim 10 wherein, when the duty cycle of the output voltage is less than fifty percent (50%) the finite state machine controls the first, second, third, and fourth switches to transition through a sequence of states that in order include a first state, a second state, a third state, and a fourth state, wherein
in the first state, the first switch is turned off, the second switch is turned off, the third switch is turned on, and the fourth switch is turned on;
in the second state following the first state, the first switch is turned off, the second switch is turned on, the third switch is turned off, and the fourth switch is turned on;
in the third state following the second state, the first switch is turned off, the second switch is turned off, the third switch is turned on, and the fourth switch is turned on; and
in the fourth state following the third state, the first switch is turned on, the second switch is turned off, the third switch is turned on, and the fourth switch is turned off.

13. The circuit of claim 1 wherein the high side switches comprise a first PMOS transistor and a second PMOS transistor configured in series between a power supply voltage and a switching node, and wherein the low side switches comprise a first NMOS transistor and a second NMOS transistor configured in series between the switching node and a reference voltage.

14. The circuit of claim 1 wherein the switching signal is generated by an amplifier, the amplifier receiving an envelope tracking input.

15. The circuit of claim 1 further comprising a comparator having a first input coupled to an output voltage of the switching regulator and a second input coupled to a reference voltage.

16. A method comprising:
comparing a sensed output voltage of a switching regulator to a voltage reference to produce a first digital signal;
sensing a polarity of a current from a control amplifier of the switching regulator in response to a control signal to produce a second digital signal;
receiving the first digital signal and the second digital signal in a finite state machine to control a state of switches in an output stage of the switching regulator, wherein the output stage comprises a plurality of switches configured in series between a supply voltage and a reference voltage and at least one capacitor having a first terminal configured between a first switch and a second switch and a second terminal configured between a third switch and a fourth switch, and wherein the plurality of switches are turned on and off in response to transitions in state of the first digital signal and the second digital signal.

17. The method of claim 16 wherein when a duty cycle of an output voltage of the switching regulator is greater than a threshold duty cycle the finite state machine controls the plurality of switches to transition through a first predetermined sequence of states in response to transitions in state of the second digital signal, and wherein when the duty cycle of an output voltage is less than the threshold duty cycle the finite state machine controls the plurality of switches to transition through a second predetermined sequence of states in response to transitions in state of the second digital signal.

18. A circuit comprising:
a switching regulator comprising:
   a first switch having a first terminal coupled to a power supply voltage;
   a second switch configured between the first switch and a switching node;
   a third switch coupled to the switching node;
   a fourth switch configured between the third switch and a reference voltage;
   an inductor having a first terminal coupled to the switching node and a second terminal; and
   a capacitor having a first terminal configured between the first switch and the second switch and a second terminal configured between the third switch and the fourth switch;
an amplifier, the amplifier having an input to receive a time varying voltage control signal and an output to produce an output voltage, wherein the output of the amplifier is coupled to the second terminal of the inductor;
a duty cycle detector to generate a digital duty cycle signal to the switching regulator, the digital duty cycle signal being dependent on whether a duty cycle of an output voltage of the circuit is above a duty cycle threshold; and
a current sense hysteretic controller to sense a polarity of an output current from the amplifier, and in accordance therewith, generate a digital switching signal to the switching regulator;
wherein the switching regulator controls the first, second, third, and fourth switches based on the digital duty cycle signal and the digital switching signal.

19. The circuit of claim 18 wherein the time varying control signal is an envelope tracking signal or an average power tracking signal.

* * * * *